(12) United States Patent
Luong et al.

(10) Patent No.: US 7,961,058 B2
(45) Date of Patent: Jun. 14, 2011

(54) FREQUENCY DIVIDER USING AN INJECTION-LOCKING-RANGE ENHANCEMENT TECHNIQUE

(75) Inventors: Howard Cam Luong, Hong Kong (CN); Sujiang Rong, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 63 days.

(21) Appl. No.: 12/474,490

(22) Filed: May 29, 2009

(65) Prior Publication Data
US 2010/0301955 A1    Dec. 2, 2010

(51) Int. Cl.
    *H03B 1/00*     (2006.01)
(52) U.S. Cl. .................. 331/74; 331/76; 331/117 FE
(58) Field of Classification Search ............ 331/117 FE, 331/74, 76
    See application file for complete search history.

(56) References Cited

U.S. PATENT DOCUMENTS

| | | | |
|---|---|---|---|
| 4,608,539 A | 8/1986 | Lawton | |
| 4,806,872 A | 2/1989 | Cowley | |
| 6,748,204 B1 * | 6/2004 | Razavi et al. | ............ 455/296 |
| 6,867,656 B2 | 3/2005 | Hajimiri et al. | |
| 7,138,879 B2 | 11/2006 | Su | |

OTHER PUBLICATIONS

Chien et al., "40GHz wide-locking-range regenerative frequency divider and low-phase-noise balanced VCI in 0.18μm CMOS," *2007 IEEE International Solid-State Circuits Conference (ISSCC 2007)*, Session 30, Building Blocks for High-Speed Tranceivers, 30.4 (2007).
Lee et al., "A 40-GHz frequency divider in 0.18μm CMOS technology," *IEEE J. Sol. State Cir.*, 39: 4, 594-601 (Apr. 2004).
Mazzanti et al., "Analysis and design of injection-locked LC dividers for quadrature generation." *IEEE J. Sol. State Cir.*, 39: 9, 1425-1433 (Sep. 2004).
Rong et al., "A 1V 4GHz-and-10GHz transformer-based dual-band quadrature VCO in 0.18μm CMOS," *IEEE 2007 Custom Integrated Circuits Conference (CICC)*, 817-820 (2007).
Tiebout, A CMOS direct injection-locked oscillator topology as high-frequency low-power frequency divider, *IEEE J. Sol. State Cir.*, 39: 7, 1170-1174 (Jul. 2004).
Wu et al., "A 19GHz 0.5mW 0.35μm CMOS frequency divider with shunt-peaking locking-range enhancement," *2001 IEEE International Solid-State Circuits Conference (ISSCC 2001)*, Session 26, Wireless Building Blocks II, 26,3 (2001).

* cited by examiner

*Primary Examiner* — Joseph Chang
(74) *Attorney, Agent, or Firm* — Leydig, Voit & Mayer, Ltd.

(57) ABSTRACT

A locking range enhancement technique is described that steers away part of the DC current and reuses it to generate more injected AC current to the injection-locked resonator-based frequency dividers (ILFDs). The injection-enhanced ILFDs maintain the key features of ILFDs, which are high speed and low power consumption, without requiring any extra inductive component and thus extra chip area.

28 Claims, 16 Drawing Sheets

FREQUENCY DIVIDER USING AN INJECTION-LOCKING-RANGE ENHANCEMENT TECHNIQUE

TECHNICAL FIELD

The present invention is related to signal processing in general and to injection-locked frequency dividers in particular.

BACKGROUND OF THE INVENTION

Frequency dividers are one of the most critical building blocks in wireless and wireless communication systems. They are essential in frequency synthesis, as illustrated in FIG. 1, in a typical frequency synthesizer 100, a frequency divider is used to divide the frequency down from the voltage-controlled oscillator (VCO) and generate a lower frequency signal to be compared with an input high frequency accuracy reference signal, which is normally from a crystal oscillator. With a differential-input, periodic, low phase noise signal source, both in-phase and quadrature-phase periodic differential output signals can be generated by frequency dividers with the phase noise tracking the input signal. The in-phase and quadrature-phase signals are required in zero-IF receivers for modulation or demodulation, and in image-rejection receivers such as receivers with a Weaver or Hartley architecture.

On the other hand, the evolution of the communication systems continues to move towards higher data rates, higher bandwidths and higher operation frequencies. The high frequency applications, for example, the millimeter wave integrated circuits have attracted more and more attentions recently. Building blocks in communication systems are required to operate at higher and higher frequencies while maintaining acceptable power consumption for energy saving and battery life extension. Among different types of frequency dividers, such as static frequency dividers, miller frequency dividers and the injection-locked frequency dividers (ILFDs), the resonator based ILFDs favor the highest operation frequency at the lowest power consumption. The high quality factor (Q) resonator of the ILFD can provide high impedance around the self-oscillating frequency so that only small biased current is needed for the divider to build up oscillation. However, also due to the high-Q of the resonator, the locking range of the ILFD is narrow. This further limits the applications of the ILFDs in wide band systems as well as in narrow band systems because of the process, voltage supply and temperature (PVT) variations.

BRIEF SUMMARY OF THE INVENTION

Described herein is an injection-locked frequency divider with injection enhancement having a locking range.

According to some embodiments, the injection-locked frequency divider comprising a biasing circuit for receiving an input signal having a first frequency and for generating an injection current component and a DC current component in response to the input signal, an oscillator for generating an output signal having a second frequency in response to the injection current component and the DC current component, and a current source for improving the locking range by providing the oscillator with a bleed current component coupled with the injection current component and the DC current component. Additionally, the bleed current is reused by a voltage-to-current converter to generate an additional injection current from the input signal.

The first frequency is a multiple of the second frequency. The oscillator includes a differential transistor pair having a first and a second transistors and the biasing circuit includes a third transistor.

According to a further embodiment, the current source includes a fourth transistor for generating the bleed current. In addition, each of the first, the second, the third, and the fourth transistors is selected from a group of a metal oxide semiconductor (MOS) transistor, a high electron mobility transistor (HEMT), a bipolar junction transistor (BJT), and a heterojunction bipolar transistor (HBT).

According to some other embodiments, a method is provided for improving a locking range of an injection-locked frequency divider. The method includes receiving an input signal having a first frequency, generating an injection current and a DC current based in part on the input signal, generating an output signal having a second frequency in response to the injection current and the DC current, and improving the locking range by combining a bleed current with the injection current and the DC current. Additionally, the bleed current is reused by a voltage-to-current converter to generate an additional injection current from the input signal.

DETAILED DESCRIPTION OF THE INVENTION

Described herein is a method and system for effectively improving the locking range of a resonator based injection-locked frequency dividers without using area-consuming inductive components. This invention also provides a method and system for improving the response speed and reducing the power consumption of an injection-locked frequency divider. In addition, the invention provides a frequency divider that is structurally simple and can be applied to a wide range of high frequency applications. The following descriptions include several embodiments of the present invention.

Figure 1:
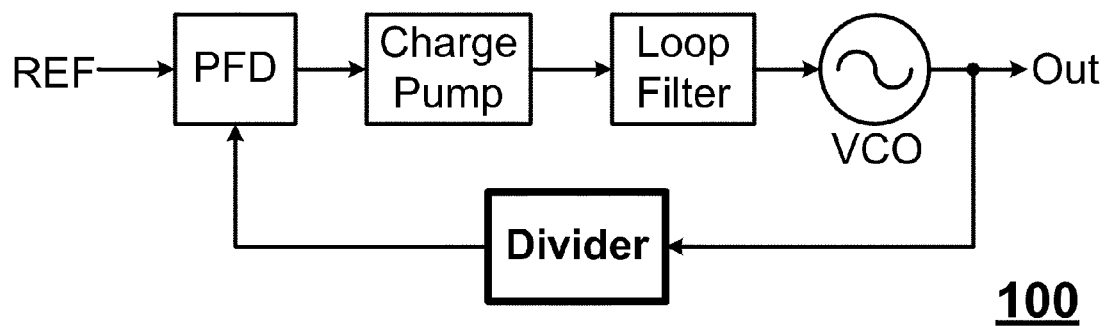
FIG. 1 is a block diagram of a typical frequency synthesizer with low frequency reference signal in and high frequency out.
Figure 2:
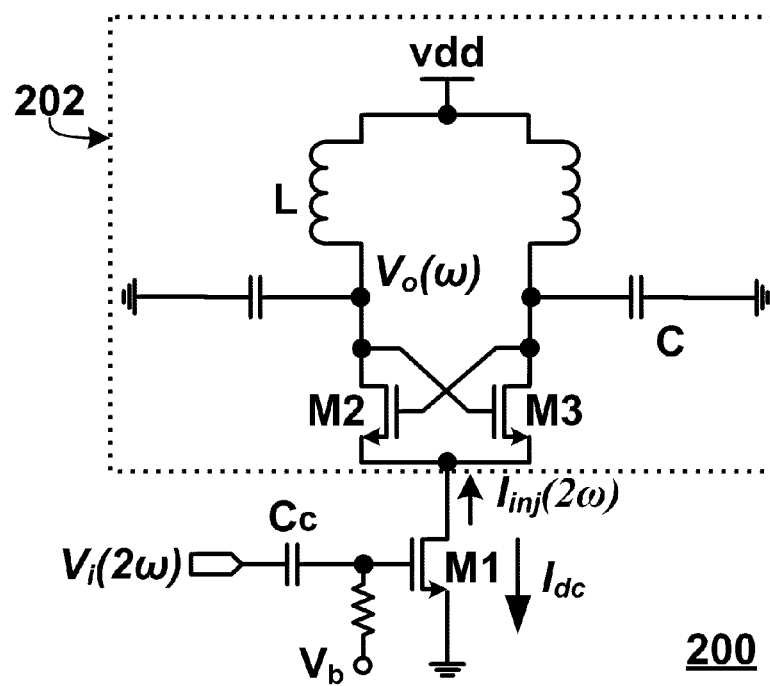
FIG. 2 is a diagram of a conventional injection-locked frequency divider circuit, injected from the bottom tail current transistor.

Referring first to FIG. 2, a basic injection-locked frequency divider is built on an inductor-capacitor (LC) based oscillator 202, where the L and C constitute a high-Q resonator with a peak frequency at $\omega_0$. The transistors M2 and M3 form a positive feedback through the cross connection, as a negative trans-conductance (Gm) cell to compensate the loss of LC resonator. The input voltage signal $V_i(2\omega)$ at around the double frequency of $\omega_0$ is applied to the gate of the bottom transistor M1. The transistor M1 simultaneously provides the biased DC current $I_{dc}$ to oscillator 202 and converts the input voltage signal to the current signal $I_{inj}(2\omega)$, which is injected into the oscillator from the common node and forces the oscillator oscillating at frequency $\omega$. The injection-locked frequency divider (ILFD) inherits the features of the LC-oscillators including high operation frequency, low power consumption, and low phase noise. However, due to the high-Q of the resonator, the locking range of the divider is very narrow, limiting the divider's applications.

Figure 3:
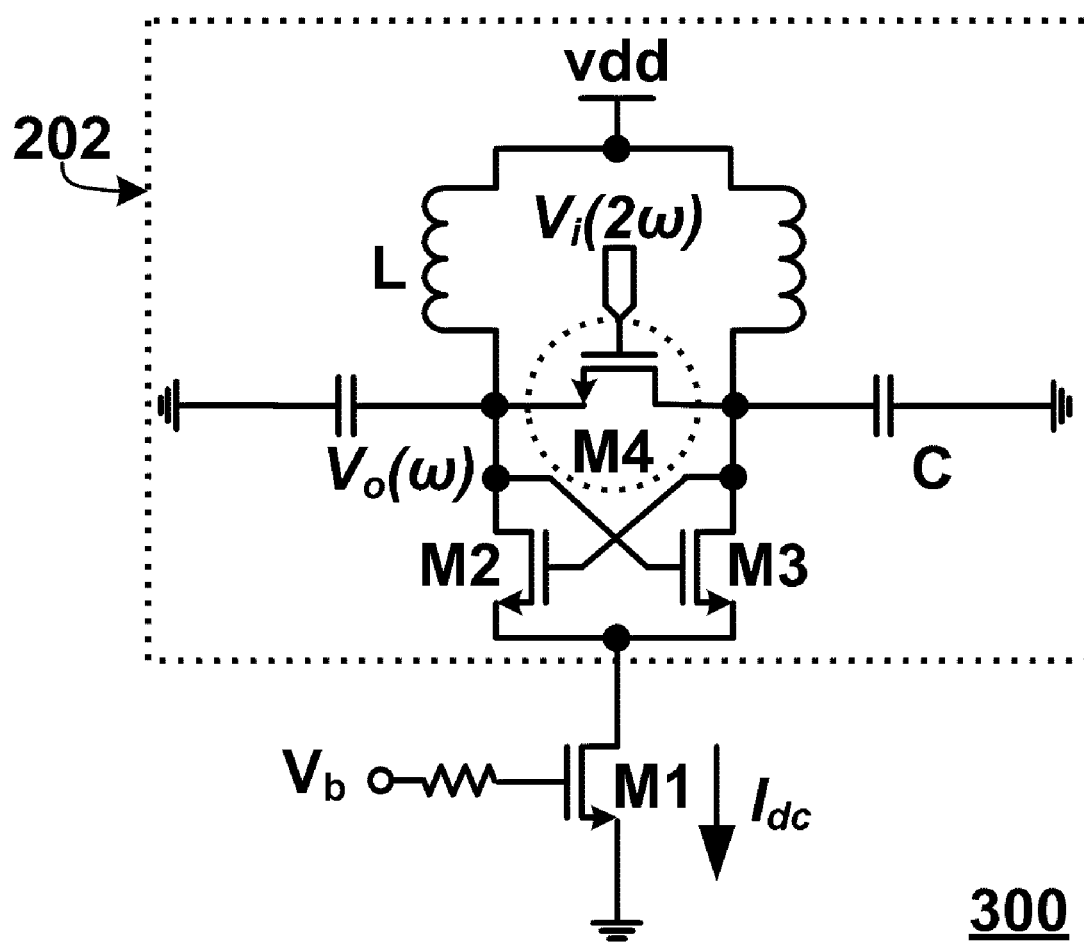
FIG. 3 is a diagram of an injection-locked frequency divider circuit, injected directly from the LC-based resonator.

Another injection-locked frequency divider is illustrated in FIG. 3, where the injection to the oscillator 202 is applied by directly coupling the injection transistor M4 to the LC-resonator. By doing so, the input voltage signal $V_i(2\omega)$ can be avoided to put on the gate of the bottom transistor M1 which is normally large in size as it needs to provide enough $I_{dc}$ to the oscillator 202. Thus, the input capacitance of the divider can be reduced. However, this type of ILFD still has the problem of the narrow locking range, which is insufficient in many applications.

Figure 4:
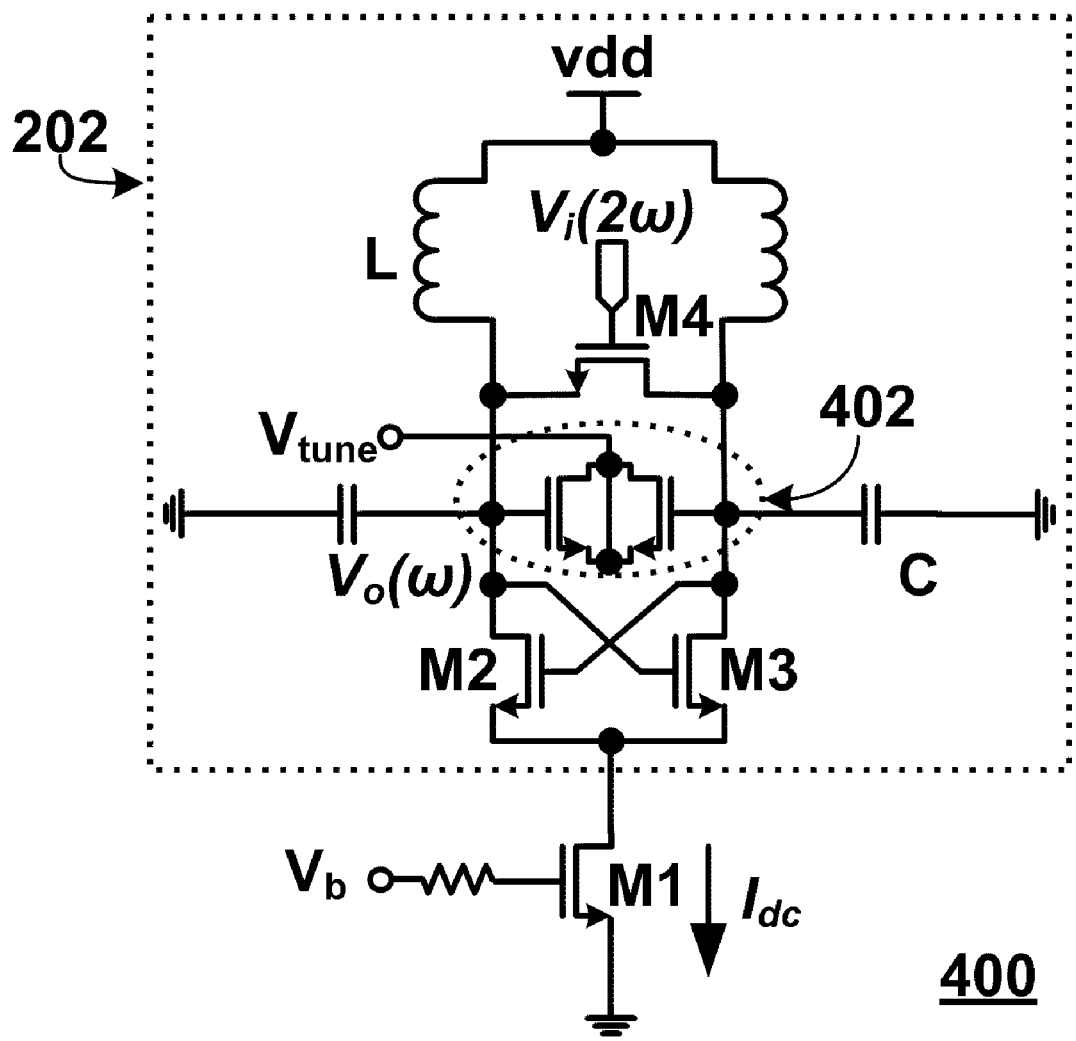
FIG. 4 is a diagram of an injection-locked frequency divider circuit, injected directly from the LC-based resonator, and with tuning varactors to adjust the input sensitivity of the divider.

FIG. 4 illustrates an injection-locked frequency divider with the frequency adjustment. It is based on the divider 300 where a frequency tuning part 402 is added. The tuning part 402 includes varactors, with all the conducting terminals, drains and sources tied together as the voltage controlled node and with the gates of the two transistors connected separately to the differential nodes of the LC-resonator. By doing so, the peak frequency $\omega_0$ can be adjusted, and thus the operation frequency range of the ILFD can also be adjusted. For the divider 400, a controlled voltage $V_{tune}$ is required to dynamically control the operation frequency of the divider to make it follow the input frequency under different conditions. In addition, an extra feedback control system is required and, therefore, is power consuming and structurally complicated.

Figure 5:
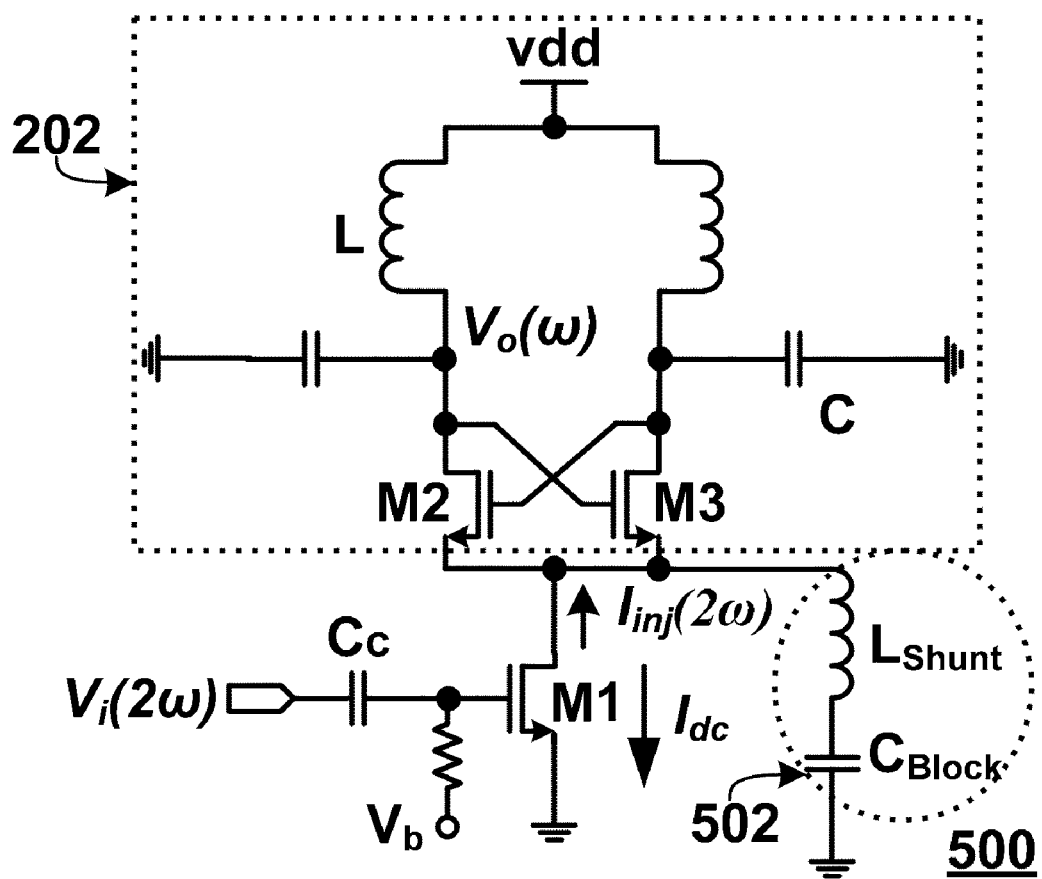
FIG. 5 is a diagram of an injection-locked frequency divider circuit, injected from the bottom tail current transistor and employing shunt inductive peaking to increase the locking range.

FIG. 5 illustrates an injection-locked frequency divider with shunt peaking. To enlarge the locking range of the conventional ILFD 200, an extra circuit 502 is added, where the $L_{shunt}$ is used as a shunt peaking inductor and the $C_{Block}$ is used to prevent the $I_{dc}$ flowing away to the ground by the $L_{shunt}$. By adding component 502, the parasitic capacitance at the drain node of the M1, contributed by either the transistor M1 or the cross-connected transistors M2 and M3, can be resonated out around the input frequency $2\omega$. This system requires the inductor $L_{shunt}$ matching well with the inductor in the oscillator 202. More importantly, the ILFD 500 requires an extra inductive component, which requires a large chip area and therefore is not economically suitable for integrated circuits.

Figure 6:
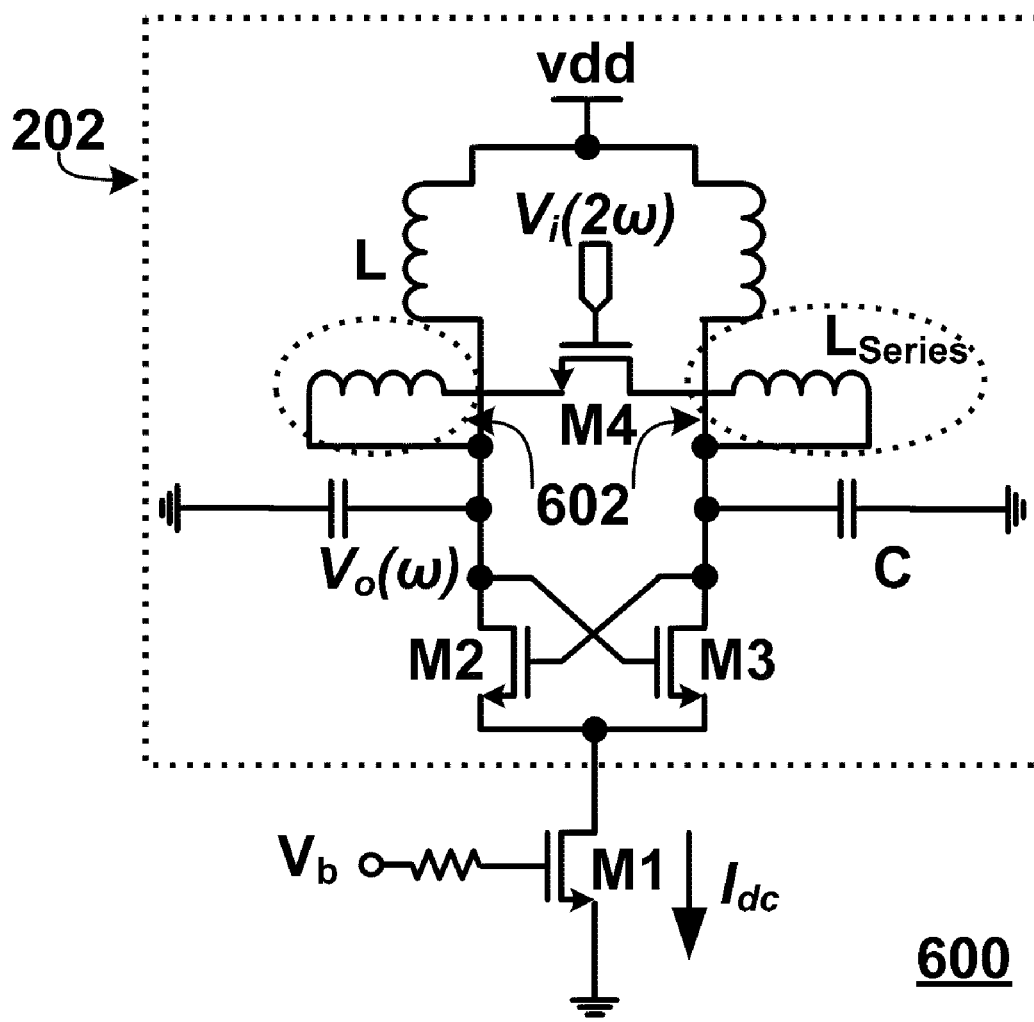
FIG. 6 is a diagram of an injection-locked frequency divider circuit, injected directly from the LC-based resonator and employing series inductive peaking to increase the locking range.

FIG. 6 depicts a diagram of another injection-locked frequency divider with series peaking. Based on the divider 300, two inductors 602 are added. If the inductor $L_{series}$ is carefully chosen, the effective swing between the drain and source node of M4 can be increased and thus the conversion gain of M4 can be improved. As a result, the locking range of the divider 600 is improved compared with the divider 300. However, similar to the divider 500, the improvement requires extra inductive components, and thus requires a large chip area and is difficult to integrate in the integrated circuits.

Figure 7:
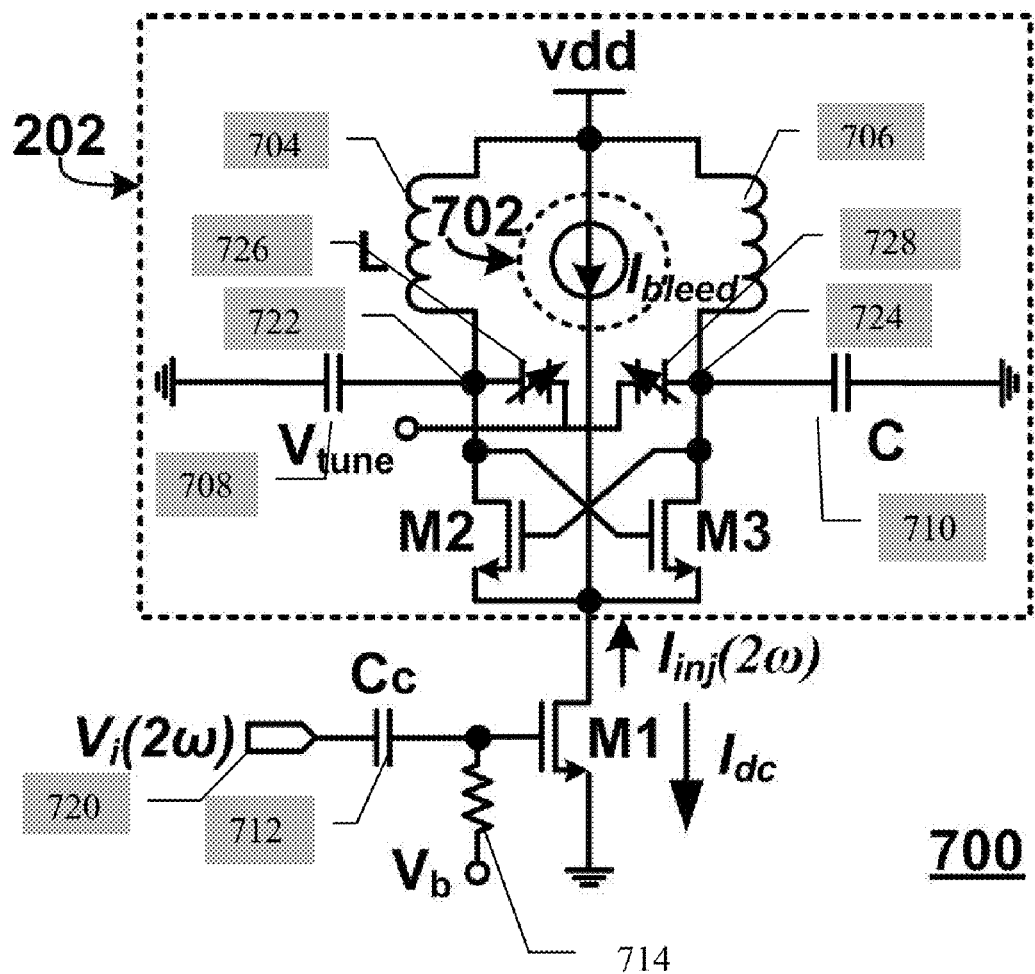
FIG. 7 is a diagram of an injection-locked frequency divider circuit with current bleeding to increase the locking range, in accordance with an exemplary embodiment of the present invention.

FIG. 7 shows an embodiment of the injection-locked frequency divider 700 according to one embodiment, where a bleeding current source 702 $I_{bleed}$ is added between the voltage supply $V_{dd}$ and the injection node 703, i.e., the drain of the M1 in 700, to improve the locking condition of the divider and thus increase the locking range.

Figure 8:
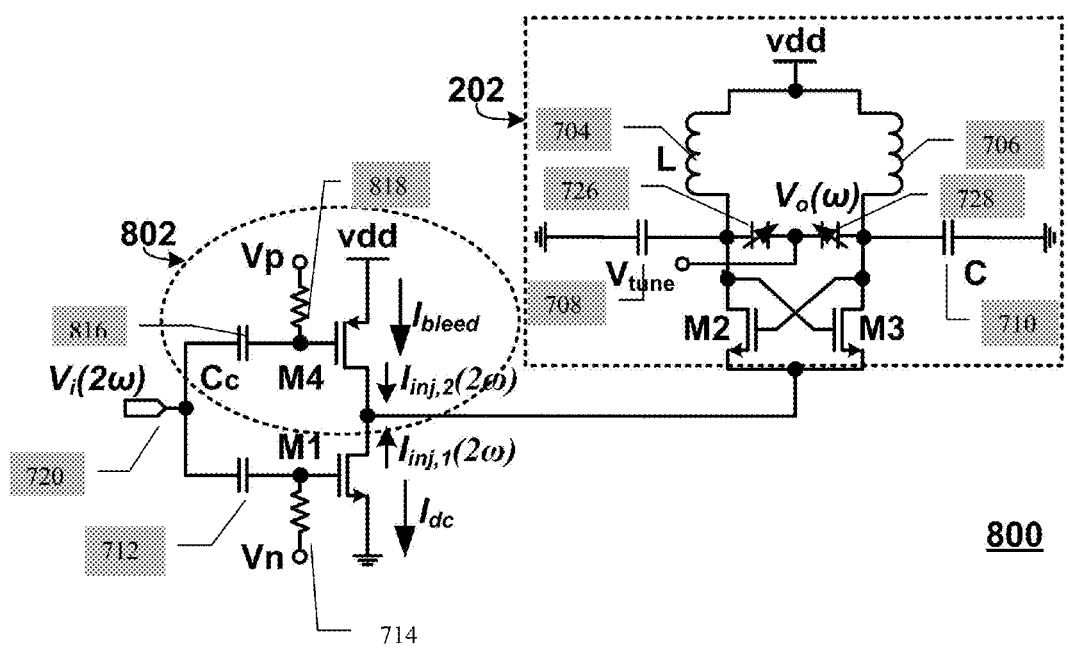
FIG. 8 is a diagram of an injection-locked frequency divider circuit with injection-enhancement to increase the locking range, in accordance with an exemplary embodiment of the present invention.

FIG. 8 is another embodiment, where, in addition to the injection transistor M1, another injection part 802 including a transistor M4 with an AC coupling circuitry is added to improve the locking range of the divider 202.

Figure 9:
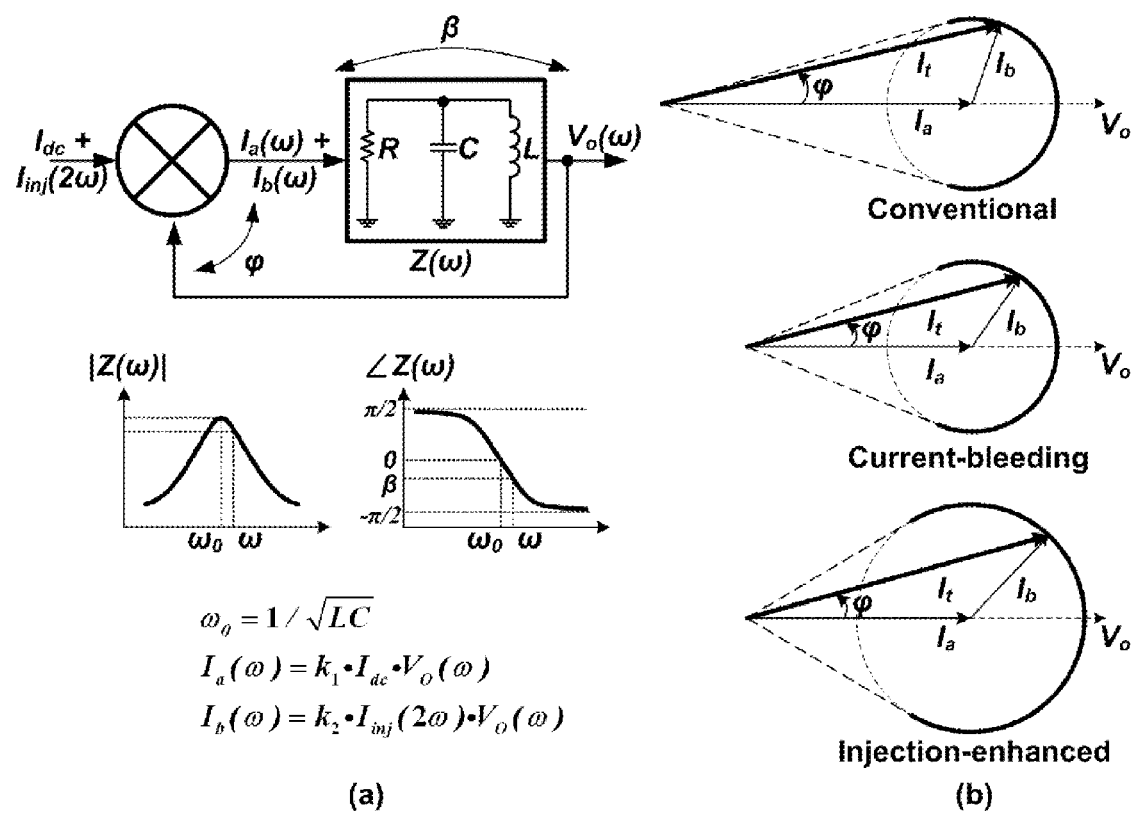
FIG. 9(a) illustrates the behavioral mode of the injection-locked frequency dividers.
FIG. 9(b) illustrates the current phasor diagrams of conventional injection-locked frequency dividers and two injection-locked frequency dividers with locking range enhancement in keeping with the invention.

FIG. 9 depicts operation of the invention based on a behavioral model of the injected oscillator 202 drawn in FIGS. 7 and 8. The differential pair $M_2$ and $M_3$ of FIGS. 7 and 8 act as a single-balanced mixer for mixing the fed-back output voltage $V_o$ at frequency $\omega$ with both the DC current $I_{dc}$ and the AC current $I_{inj}$ at frequency $2\omega$ provided by the tail transistor $M_1$. The current ratio $|I_{inj}|/|I_{dc}|$ is defined as the injection ratio $\eta$. $I_a$ and $I_b$ are the mixing products of $I_{dc}$ and $V_o$, $I_{inj}$ and $V_o$, with the conversion coefficients $k_1$ and $k_2$, respectively. Due to the high selectivity of the LC-resonator, only the current components at frequency $\omega$ are considered at the mixer's output.

Two conditions need to be satisfied for the dividers shown in FIGS. 7 and 8 to work properly. The first one is that the loop gain needs to be at least unity. This is easy to satisfy as long as $I_{dc}$ is large enough for self-oscillation. The second condition is that the total phase shift in the loop needs to be zero. As shown in FIG. 9(a), the phase shift φ at the mixer needs to compensate the phase shift β induced by the LC-tank at the operation frequency ω. Because of the high-Q of the LC-tank, as ω moves away from $ω_0$, |β|, the absolute value of β, increases rapidly, and therefore |φ| needs to be increased accordingly. As shown in the phasor diagrams in FIG. 9(b), the maximum |φ| is given by arcsin($|I_b|/|I_a|$), which is proportional to ($k_2/k_1$)·η. Due to the mixing property, the conversion coefficient $k_2$ is always smaller than $k_1$, which limits the achievable maximum |φ|. As a result, increasing the injection ratio η is critical for the improvement of the phase condition and thus the locking range of the ILFD.

Under normal conditions, given a fixed input swing, the injection ratio η can be increased by reducing the bias gate voltage of M1 to operate it in Class-C mode instead of Class-A mode. However, the size of M1 would need to be increased rapidly to maintain the biasing current, which would result in large parasitic capacitance at the drain node and limit the effective achievable injection ratio. Divider 700 provides a simple solution to improve the injection ratio by steering away a portion of the DC current from M2 and M3. As shown in FIG. 7, a current source is connected from $V_{dd}$ to the common-source node 703. The current bleeding also reduces the overdrive voltage of M2 and M3 and thus improves the switching of the single-balanced mixer. The current source can be simply implemented by a resistor or a PMOS with a constant gate bias voltage.

As shown in FIG. 8, the injection ratio can also be improved further by applying the AC input signal to the gate of the bleeding PMOS M4 instead of a constant gate voltage. Accordingly, the PMOS M4 transistor acts not only to reduce the DC current but also to inject more AC current $I_{inj,2}$ to the divider. Since the bleeding current is reused to bias the PMOS transistor, no extra power is required. According to FIG. 8, when the input signal $V_i$ is applied at the terminal 720, a first injection current $I_{inj,1}$ is generated by the PMOS M1 along with a DC bias current $I_{dc}$ and a bleed current $I_{bleed}$. At the same time, the bleed current $I_{bleed}$ is reused by the PMOS M4 for generating a second injection current $I_{inj,2}$. Compared with the embodiment shown in FIG. 7, the injection-locked frequency divider 800 in FIG. 8 is more efficient in improving the injection ratio due to the additional injection current generated by the PMOS M4. In other words, the circuit including capacitor Cc, resistor Vp, and PMOS M4 can be treated as a voltage-to-current convertor that convert the input voltage signal $V_i$ into the second injection current $I_{inj,2}$ by reusing the bleed current $I_{bleed}$.

FIG. 9(b) shows the differences on the phasor diagrams between the conventional ILFD 200 and the ILFDs based on current bleeding and injection enhancement according to the invention as shown in FIGS. 7 and 8. According to the embodiment 700, by keeping $|I_b|$ constant and reducing $|I_a|$, the phase condition and thus the locking range are improved. According to the embodiment 800, by increasing $|I_b|$ and reducing $|I_a|$ at the same time, the phase condition and thus the locking range can be significantly improved. Finally, in the preferred embodiment 800, ac coupling is implemented for both M3 and M4 to enable the divider to operate at a lower supply voltage.

Figure 10:
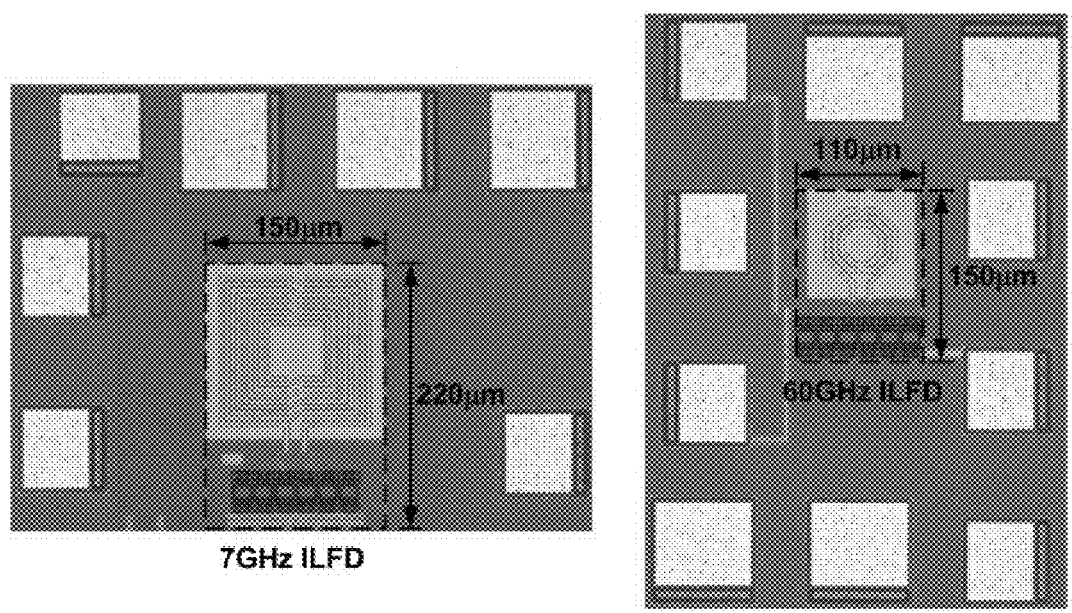
FIG. 10 is a diagram of die photos of two injection-locked frequency dividers with locking range enhancements in keeping with the invention and with input frequencies around 7 GHz and 60 GHz, respectively.

Two dividers with the same topology shown in 800 are designed and fabricated in UMC's 0.13 μm CMOS process as well known in the art. The first divider is designed to operate around 7 GHz, in which the transistors M3 and M4 are biased in Class-AB mode to provide the required bias current with small sizes. The shunted DC current through M4 is set as large as possible to maximize the trans-conductance of M4 while leaving enough DC current through M1 and M2 for the divider's self-oscillation, which is necessary to guarantee the ILFD to operate with a lower power compared to that of a Miller divider. To further demonstrate the feasibility of the technique of the invention for a wide range of frequencies and applications, a second divider is designed to operate around 60 GHz. FIG. 10 shows the die photographs of the two ILFDs, which occupy active areas of 0.033 mm² and 0.0165 mm², respectively. The two ILFD prototypes measure triple and double improvements on the locking range compared to the locking range of the conventional ILFD 200, while consuming only 0.9 mW and 1.6 mW from a 0.8V supply voltage.

Figure 11A:
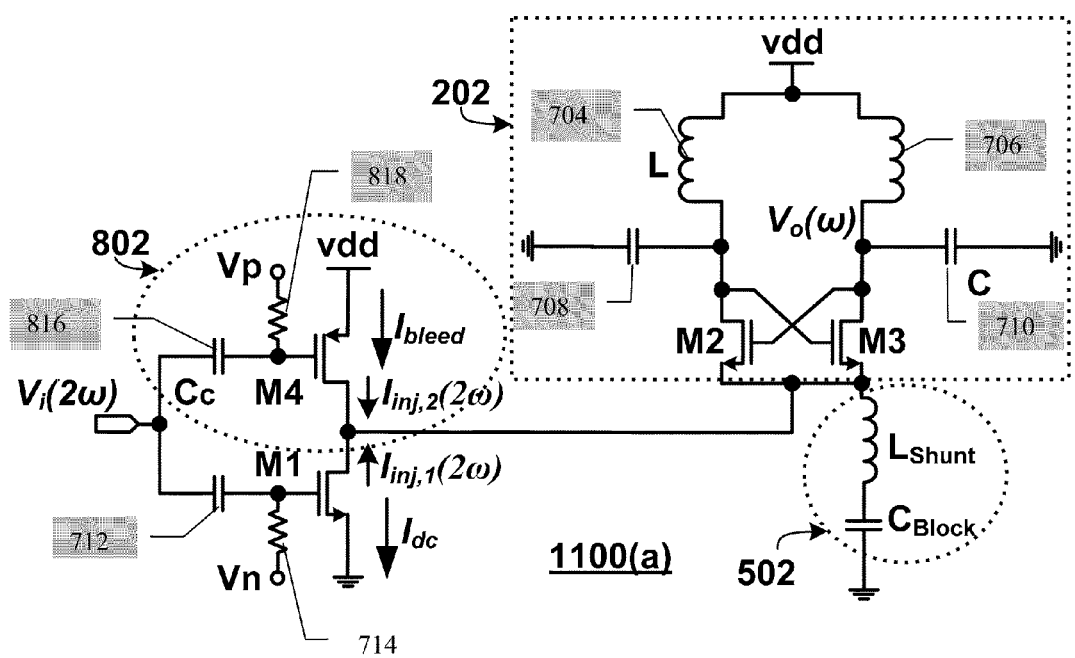
FIG. 11(a) is a diagram of an injection-locked frequency divider circuit having a dedicated locking range provided by the injection-enhancement technique of the invention with shunt peaking in accordance with an exemplary embodiment of the present invention.
Figure 11B:
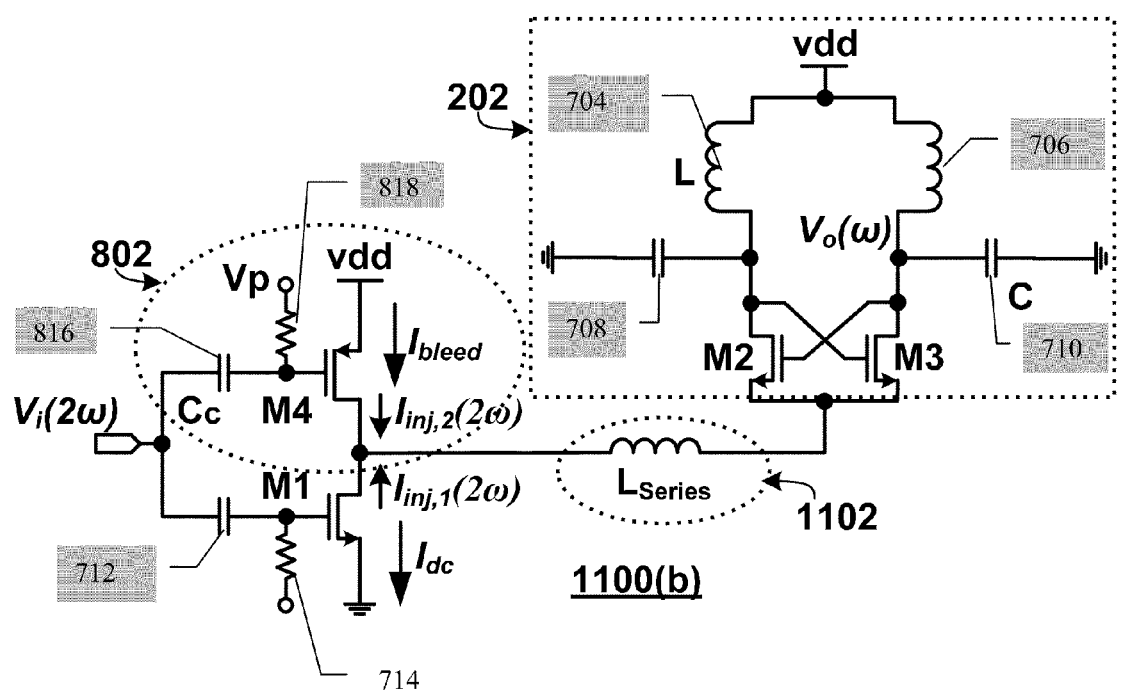
FIG. 11(b) is a diagram of an injection-locked frequency divider circuit having a dedicated locking range provided by the injection-enhancement technique of the invention with series peaking in accordance with another exemplary embodiment of the present invention.

FIGS. 11(a) and 11(b) depict the schematic diagrams of two injection-enhanced ILFD embodiments with dedicated locking range performance. Based on the divider 800, a shunt peaking element 502 and an inductive component 1102 for series peaking are added in FIG. 11(a) and FIG. 11(b), respectively. As the added transistor M4 for injection enhancement would bring extra parasitic capacitance onto the injection node of 202, which could affect the injection ratio especially at high frequencies, a shunt or series inductive peak can help resonate the parasitic capacitance. The inductive components can also be implemented by transmission lines at millimeter wave frequencies to avoid magnetic coupling between the inductive components in 202, without using too much chip area.

Figure 12:
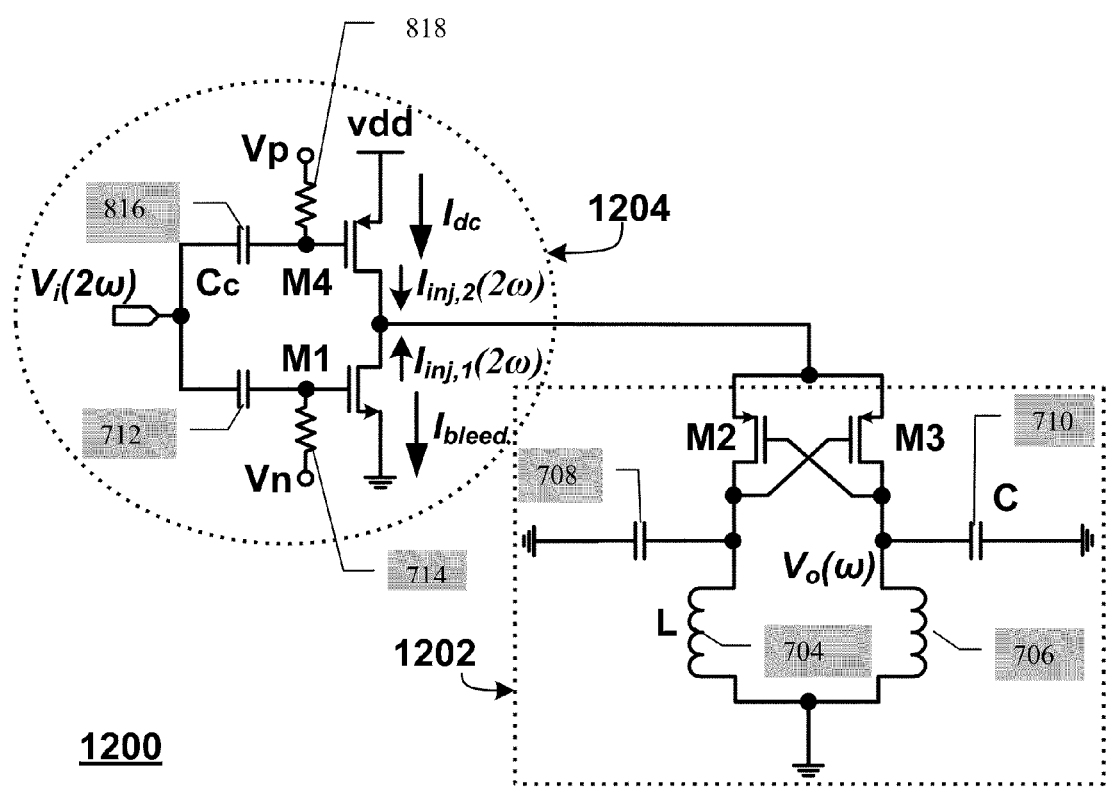
FIG. 12 is a diagram of an injection-enhanced injection-locked frequency divider circuit, employing P-channel MOSFET as most of the active devices, in accordance with an exemplary embodiment of the present invention.

Another embodiment of the present invention is depicted in FIG. 12. Compared with the divider 800, the oscillator 1202 comprises two P-channel MOSFETs, M2 and M3, and the corresponding injection circuit element 1204 comprises a PMOS M4 determining the total DC current and the NMOS M1 that steers away the DC current and reusing the DC current to generate more injected AC current.

Figure 13:
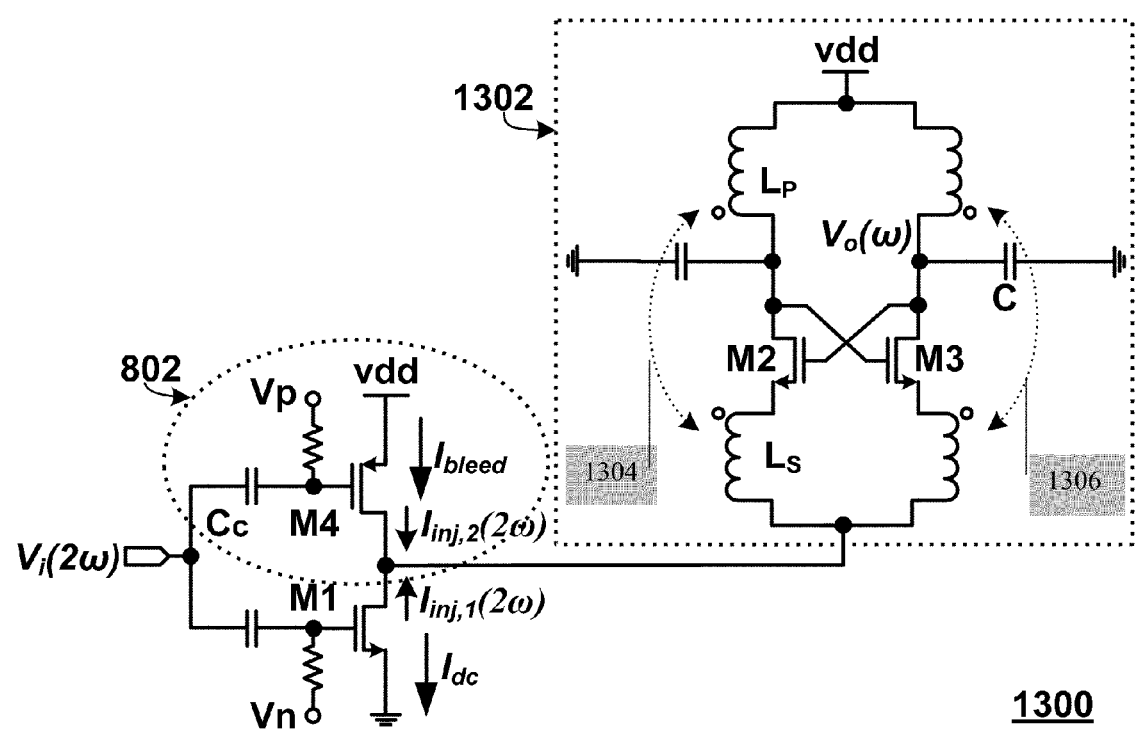
FIG. 13 is a diagram of an injection-enhanced injection-locked frequency divider circuit, employing transformer feedback to enable low voltage low power operation, in accordance with an exemplary embodiment of the present invention.

FIG. 13 depicts another embodiment of the injection-enhanced ILFD for low-voltage, low-power applications. The oscillator 1302 uses transformers for positive feedback between the drain node and the source node of transistors, M2 and M3. By including the transformer, the drain swing of M2 and M3 can be much higher than the voltage supply $V_{dd}$ and the source swing of M2 and M3 can also be much lower than the DC voltage. As a result, the required headroom for the oscillator 1302 can be effectively reduced. Therefore, the divider 1300 is able to operate at a low supply voltage.

Figure 14:
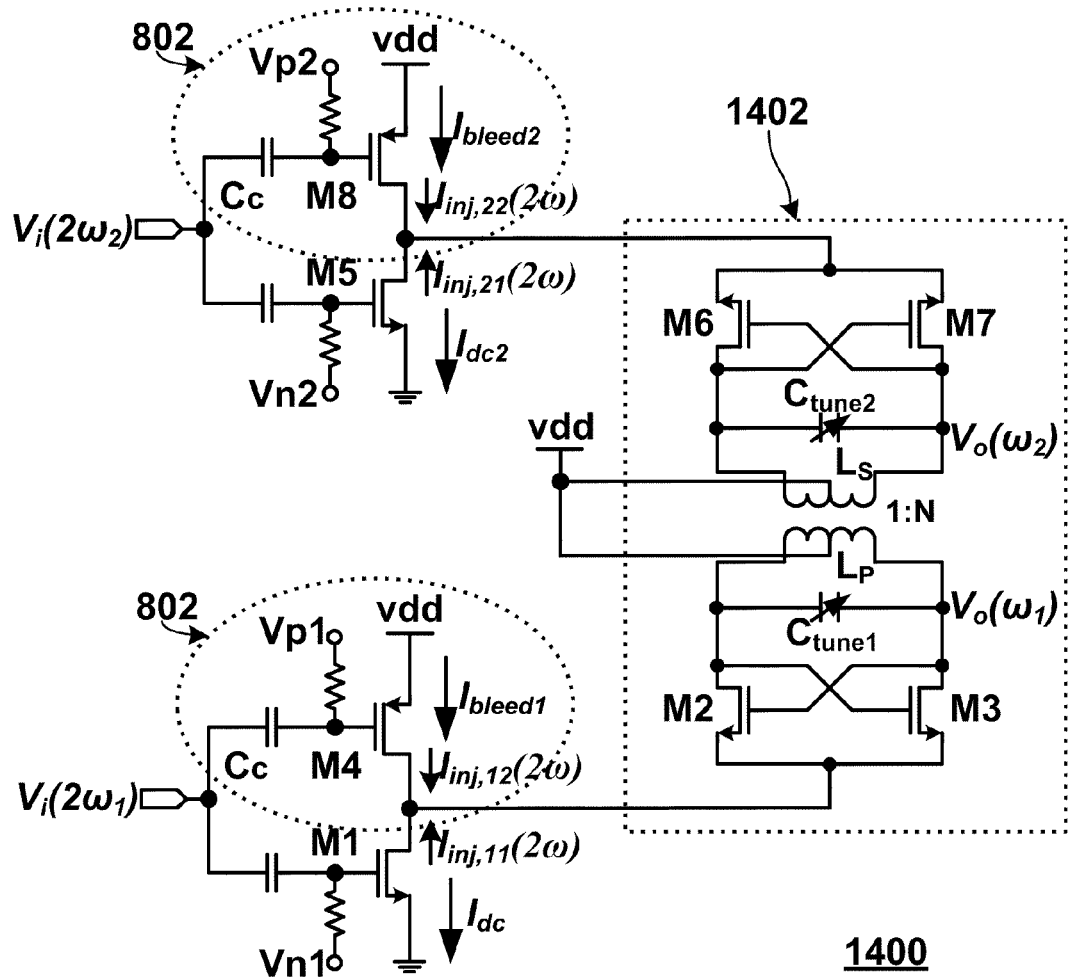
FIG. 14 is a diagram of an injection-enhanced injection-locked frequency divider circuit, featuring dual-band dividing operations, in accordance with an exemplary embodiment of the present invention.

In the embodiment of the invention illustrated in FIG. 14, the divider 1400 is able to divide two different input frequencies and generate two different output frequencies, respectively, each with enhanced locking ranges. The divider 1400 uses a transformer based dual-band oscillator 1402 as the divider core. The varactors $C_{tune1}$ and $C_{tune2}$ are used to fine-tune the oscillation frequencies of the dual-band oscillator 1402. The dual-band divider 1400 simultaneously provides two ILFDs with the properties of high frequency, low power, and wide locking range, while only occupies the area of one inductive coil. The transformer can be implemented as differential center-tapped one.

Figure 15:
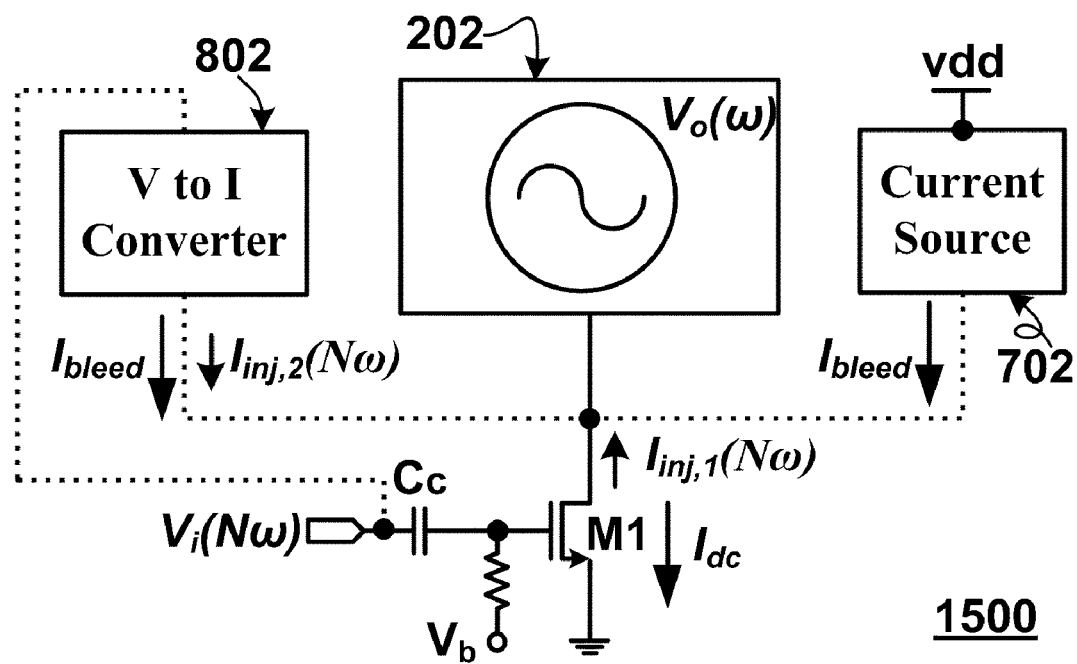
FIG. 15 is a diagram of an injection-enhanced injection-locked frequency divider with the function of divide-by-N, where N can be any integral number no less than 2, in accordance with a more general embodiment of the present invention.

FIG. 15 is a diagram of the system for improving the locking range of a resonator based injection-locked frequency dividers according to one embodiment, where the input frequency to the ILFD 1500 is around N times of the oscillation frequency of the divider 200. As illustrated in FIG. 15 and FIG. 9(a), the output voltage $V_o$ is feedback to the mixer for mixing with the input signal. If the input frequency is 2ω, it mixes with the fundamental frequency ω of the feedback signal and generates the output component at frequency ω. This output component is then injected into the LC-resonator and converted into output voltage again, sustaining the operation of the feedback loop. When the input frequency is Nω, to generate the output component at frequency ω, the input signal is mixed with the feedback signal having the harmonic frequency of (N−1)ω. The output swing of the divider is very large so that the transistors M2 and M3 in the resonator 202 operate in their non-linear ranges.

In addition, if the resonator 202 utilizes a differential configuration, only odd harmonics of $V_o$ can be mixed with the input signal. As a result, only even values for N can be obtained. In order to mix the even harmonics of $V_o$ with the input signal and to obtain the odd values for N, the oscillator 202 in FIG. 15 can utilize a non-differential configuration. Accordingly, the divider 1500 can obtain a division ratio N having odd values. In combination, this invention provides an injection-enhanced ILFD with an arbitrary division ratio N, where N is integral number equal to or larger than two.

According to FIG. 15, transistor M1 is used to generated a bias current $I_{dc}$ for biasing the resonator 202. Additionally, a bleed current Ibleed is generated by a current source 702 connected between the voltage source $V_{dd}$ and transistor M1. As the input signal $V_i$ in applied to the transistor M1, a first injection current $I_{inj,1}$ is generated by current source 702 and transistor M1 for adjusting the locking rage of resonator 202. In addition, a voltage-to-current 802 can be used to generate a second injection current $I_{inj,2}$ from input signal $V_i$ by reusing bleed current $I_{bleed}$. This additional injection current $I_{inj,2}$ can then be used to further adjust the locking rage of the circuit.

According to still some other embodiments, an injection-locked frequency divider with injection enhancement is described herein. As illustrate in FIGS. 7 and 8, the frequency divider 800 comprising an input terminal 720, first and second differential output terminals 722 and 724, first and second inductors 704 and 706, four three-terminal devices M2, M3, M1, and M4, each of the three-terminal devices having a control terminal and first and second conducting terminals. The frequency divider 700 further includes a resonator 202 formed by the first and the second inductors 704 and 706 connected electrically with physical capacitors 708 and 710 to form a differential inductor-capacitor (LC) tank having the first and second differential terminals and a third terminal. The third terminal of the resonator 202 is connected to an alternating current (AC) ground. The first terminal of the resonator is connected to the first conducting terminal of the first three-terminal device M2 and coupled to the control terminal of the second three-terminal device M3. The second terminal of the resonator 202 is connected to the first conducting terminal of the second three-terminal device M3 and coupled to the control terminal of the first three-terminal device M2. According to the invention, each of the four three-terminal devices M1, M2, M3, and M4 is selected from a group of a metal oxide semiconductor (MOS) transistor, a high electron mobility transistor (HEMT), a bipolar junction transistor (BJT), and a hetero-junction bipolar transistor (HBT).

The first conducting terminal of the third three-terminal device M1 is connected to both the second conducting terminal of the first three-terminal device M2 and the second conducting terminal of the second three-terminal device M3. The second conducting terminal of the third three-terminal M1 is connected to a voltage supply (Vdd) or a ground (GND). The first conducting terminal of the fourth three-terminal device M4 is also connected to the second conducting terminals of both the first and second three-terminal devices M2 and M3. The second conducting terminal of the fourth three-terminal device M4 is also connected to the GND or the VDD, where the third and fourth three-terminal device M1 and M4 are connected in series between the GND and the VDD. The input terminal 720 is connected to the control terminal of the third three-terminal device M1 and the control terminal of the fourth three-terminal device M4. The first and the second differential terminals of the resonator 202 are utilized as the first and the second differential output terminals 722 and 724.

According to a further embodiment, the frequency divider can further include a first varactor 726 connected between the first conducting terminal of the first three-terminal device M2 and a direct-current (DC) control terminal 702, and a second varactor 728 connected between the first conducting terminal of the second three-terminal device M3 and the direct-current (DC) control terminal 702.

In one embodiment, the resonator 202 is a high-order LC-tank, including electrically connected one or more inductors, transformers, or transmission lines and one or more capacitors. Alternatively, the resonator 202 includes one or more crystal or active inductor based resonators.

The first and the second three-terminal devices M2 and M3 are complementary transistors. Furthermore, according to FIG. 11, the frequency divider comprises extra shunt inductive component $L_{shunt}$ or series inductive peaking component $L_{seriers}$.

According to FIG. 8, the AC coupling comprising a DC blocking capacitor (712 or 816) and a DC biasing resistor (714 or 818) is added to at least one of the control terminals of the third and fourth three-terminal devices M1 and M4. As shown in FIG. 15, the frequency divider can further include a voltage-to-current converter 802 for performing the functions of the bleed current source.

Furthermore, as shown in FIG. 14, two or more frequency dividers as described herein can be coupled together through active or passive couplings.

According to some alternative embodiments as depicted in FIG. 7, an injection-locked frequency divider 700 with injection enhancement includes an input terminal 720, first and second differential output terminals 722 and 724, first and second inductors 704 and 706, a plurality of three-terminal devices, each having a control terminal and first and second conducting terminals, and a DC current source 702 having first and second conducting terminals. The frequency divider 700 further includes a resonator 202 formed by the first and second inductors 704 and 706 connected electrically with physical capacitors 708 and 710 forming a differential inductor-capacitor (LC) tank, with first and second differential terminals and a third terminal. The plurality of three-terminal devices include first, second, third, and fourth three-terminal devices M1, M2, and M3.

The third terminal of the resonator 202 is connected to an alternative-current (AC) ground. The first terminal of the resonator 202 is connected to the first conducting terminal of the first three-terminal device M2, and coupled to the control terminal of the second three-terminal device M3. The second terminal of the resonator 202 is connected to the first conducting terminal of the second three-terminal device M3, and coupled to the control terminal of the first three-terminal device M2. The first conducting terminal of the third three-terminal device M1 is connected to both of the second conducting terminals of the first and second three-terminal devices M2 and M3. The second conducting terminal of the third three-terminal device M1 is connected to a voltage supply (VDD) or a ground (GND). The first conducting terminal of the DC current source 702 is also connected to both of the second conducting terminals of the first and second three-terminal devices M2 and M3. The second conducting terminal of the DC current 202 source is connected to the GND or the VDD, whichever is not connected to the second conducting terminal of the third three-terminal device M1. The input terminal 720 is connected to the control terminal of the third three-terminal device M1. The first and the second differential terminals of the resonator 202 are connected as the first and second differential output terminals 722 and 724.

The DC current source can be a physical resistor. Alternatively, as shown in FIG. 8, the DC current source can be a three-terminal device M4 having a control terminal, a first conducting terminal, and a second conducting terminal. Accordingly, the first conducting terminal of the three-terminal device M4 is used as the first conducting terminal of the DC current source, and the second conducting terminal of the three-terminal device M4 is used as the second conducting terminal of the DC current source, a biasing DC voltage Vdd is applied on the control terminal of the three-terminal device M4.

Furthermore, a first varactor 726 can be connected between the first conducting terminal of the first three terminal device and a direct current (DC) control terminal, and a second varactor 728 can be connected between the first conducting terminal of the second three terminal device and the direct-current (DC) control terminal.

The resonator 202 includes a high order LC-tank, which comprises electrically connected one or more inductors 704 and 706, transformers 1304 and 1306, or transmission lines and one or more capacitors 708 and 710. Alternatively, the resonator 202 includes crystal or active inductor based resonators. The first and the second three-terminal devices M2 and M3 can include complementary transistors. The divider can further comprise extra shunt or series inductive peaking components as shown in FIG. 11, inductor $L_{shunt}$ and $L_{series}$. The AC coupling comprising a DC blocking capacitor 712 and a DC biasing resistor 714 is added at the control terminal of the third three-terminal device M1.

Figure 16:
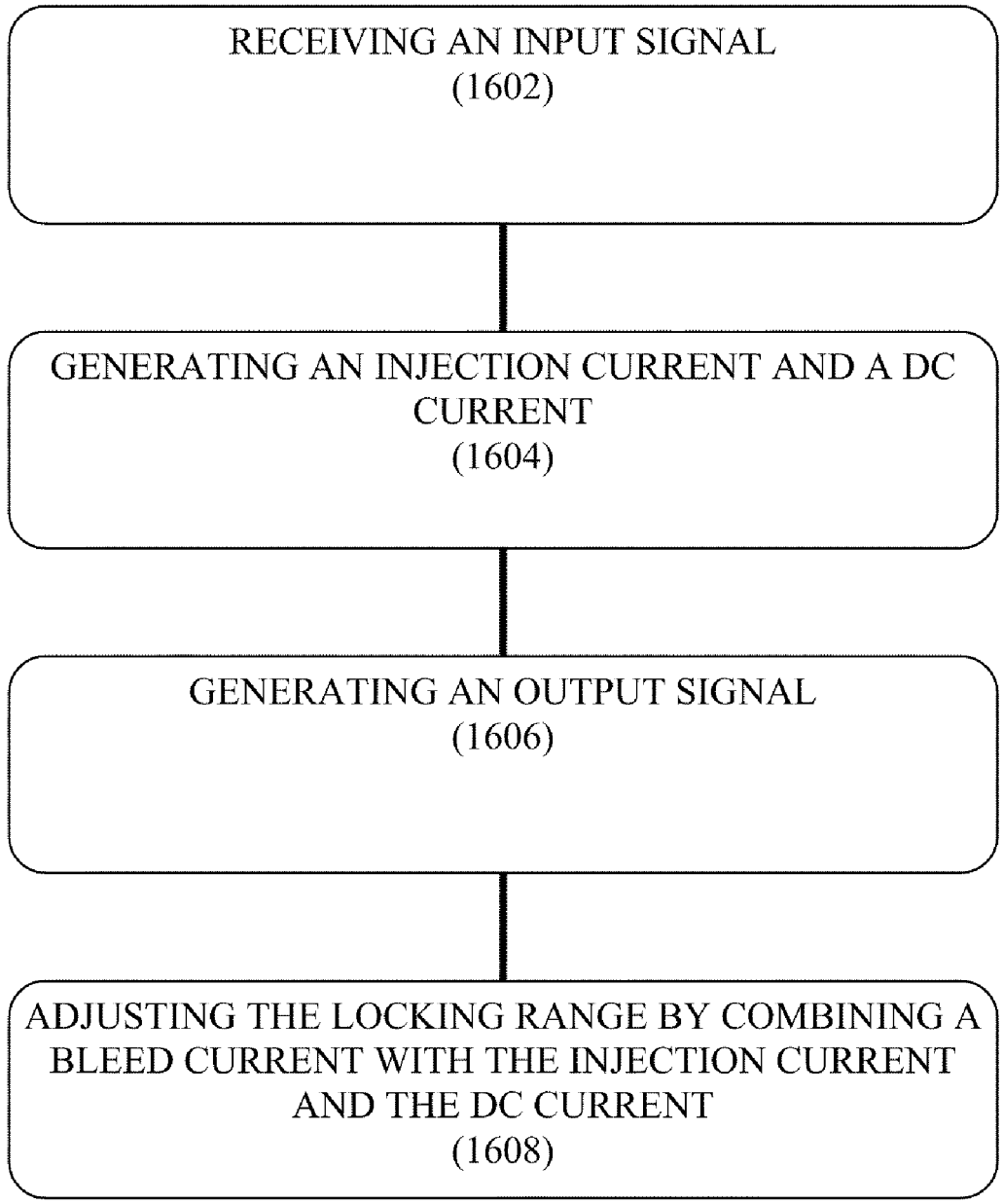
FIG. 16 is a flowchart illustrating a method for improving a locking range of an injection-locked frequency divider in accordance with the principles of the present invention.

According to another embodiment shown in FIG. 16, a method 1600 is provided for improving a locking range of a injection-locked frequency divider. Method 1600 comprising the following steps: Receiving an input signal having a first frequency (1602), generating an injection current and a DC current based in part on the input signal (1604), generating an output signal having a second frequency in response to the injection current and the DC current, wherein the first frequency is a multiple of the second frequency (1606), and adjusting the locking range by combining a bleed current with the injection current and the DC current (1608). Additionally, the bleed current is reused by a voltage-to-current converter for generating an additional injection current from the input signal. The additional injection current is used to further improving the locking range.

In addition, upon reading the specification, one skilled in the art will readily understand that the method steps 1602-1608 depicted in FIG. 16 can be carried out by the systems and structures depicted in FIGS. 7-15 and reasonable variations of them.

Although some exemplary embodiments of the invented injection-enhanced injection-locked frequency divider are disclosed here, it is not intended to unnecessarily limit the scope of the invention. Thus, simple modifications or variations without departing from the principle or the extent of the claims are still within the scope of the present invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An injection-locked frequency divider with injection enhancement having a locking range, the injection-locked frequency divider comprising:
    a biasing circuit for receiving an input signal having a first frequency and for generating an injection current component and a DC current component in response to the input signal;
    an oscillator for generating an output signal having a second frequency in response to the injection current component and the DC current component, wherein the first frequency is a multiple of the second frequency; and
    a current source for adjusting an injection ratio between the injection current component and the DC current component in order to enlarge the locking range by providing the oscillator with a bleed current component coupled with the injection current component and the DC current component.

2. The injection-locked frequency divider of claim 1, wherein the oscillator includes a differential transistor pair having a first and a second transistors.

3. The injection-locked frequency divider of claim 2, wherein the first transistor is coupled to a first LC resonator and the second transistor is coupled to a second LC resonator.

4. The injection-locked frequency divider of claim 2, wherein the first and the second transistors have a common first terminal.

5. The injection-locked frequency divider of claim 2, wherein the first and the second transistors are cross-connected through a second and a third terminals of each of the first and second transistors.

6. The injection-locked frequency divider of claim 5, wherein the third terminal of the first transistor is coupled to a first LC resonator and the third terminal of the second transistor is coupled to a second LC resonator.

7. The injection-locked frequency divider of claim 1, wherein the biasing circuit includes a third transistor.

8. The injection-locked frequency divider of claim 7, wherein the third transistor receives the input signal at a first terminal of the third transistor through a capacitor.

9. The injection-locked frequency divider of claim 8, wherein the third transistor has a second terminal connected to the common first terminal of the first and second transistors.

10. The injection-locked frequency divider of claim 1, wherein the current source is connected between a voltage source and a common first terminal of a first and a second transistors.

11. The injection-locked frequency divider of claim 10, wherein the current source includes a fourth transistor for generating the bleed current.

12. The injection-locked frequency divider of claim 11, wherein the fourth transistor has a first terminal for receiving the input signal through another capacitor.

13. The injection-locked frequency divider of claim 4, further comprising a shunt inductor including a first terminal connected to the common first terminal of the first and second transistors.

14. The injection-locked frequency divider of claim 13, wherein the shunt inductor includes a second terminal connected to a ground through a shunt peaking element.

15. The injection-locked frequency divider of claim 1, further comprising an inductive component connected in series between the biasing circuit and the oscillator.

16. The injection-locked frequency divider of claim 2, further comprising a first and second transformers for providing a positive feedback between a first and a second terminals of each of the first and the second transistors.

17. The injection-locked frequency divider of claim 1, wherein the oscillator is a transformer-based dual-band oscillator and the biasing circuit and the current source are connected to a first half of the transformer-based dual-band oscillator,
the injection-locked frequency divider further comprising another biasing circuit and another current source connected to a second half of the transformer-based dual-band oscillator.

18. The injection-locked frequency divider of claim 11, wherein each of the first, the second, the third, and the fourth transistors is selected from a group of a metal oxide semiconductor (MOS) transistor, a high electron mobility transistor (HEMT), a bipolar junction transistor (BJT), and a hetero junction bipolar transistor (HBT).

19. The injection-locked frequency divider of claim 1, further comprising a voltage-to-current converter for generating an additional injection current component from the input signal by reusing the bleed current component.

20. A method for improving a locking range of an injection-locked frequency divider comprising:
receiving an input signal having a first frequency;
generating an injection current and a DC current based in part on the input signal;
generating an output signal having a second frequency in response to the injection current and the DC current, wherein the first frequency is a multiple of the second frequency; and
adjusting an injection ratio between the injection current component and the DC current component in order to enlarge the locking range by combining a bleed current with the injection current and the DC current.

21. The method of claim 20, wherein the bleed current is generated from an AC voltage signal by a voltage-to-current converter.

22. An injection-locked frequency divider with injection enhancement, comprising:
an input terminal;
a first and a second different output terminals;
a first and a second inductors;
a first, a second, a third, and a fourth three-terminal devices, each having a control terminal, a first conducting terminal, and a second conducting terminal; and
a resonator including the first and the second inductors connected electrically with physical capacitors, forming a differential inductor-capacitor (LC) tank, the resonator having a first and a second differential terminals and a third terminal, wherein
the third terminal of the resonator is connected to a alternative-current (AC) ground;
the first terminal of the resonator is connected to the first conducting terminal of the first three-terminal device, and coupled to the control terminal of the second three-terminal device;
the second terminal of the resonator is connected to the first conducting terminal of the second three-terminal device, and coupled to the control terminal of the first three-terminal device;
the first conducting terminal of the third three-terminal device is connected to both the second conducting terminal of the first three-terminal device and the second conducting terminal of the second three-terminal device;
the first conducting terminal of the fourth three-terminal device is connected to both the second conducting terminal of the first three-terminal device and the second conducting terminal of the second three-terminal device;
the third and the fourth three-terminal devices are connected in series between a voltage supply (VDD) and a ground (GND) through the second conducting terminal of the third three-terminal device and the second conducting terminal of the fourth three-terminal device;
the input terminal is connected to the control terminal of the third three terminal device and the control terminal of the fourth three terminal device; and
the first and the second differential terminals of the resonator are the first and the second differential output terminals.

23. An injection-locked frequency divider with injection enhancement, comprising:
an input terminal;
a first and a second different output terminals;
a first and a second inductors;
a DC current source having a first conducting terminal and a second conducting terminal;
a first, a second, and a third three-terminal devices, each having a control terminal, a first conducting terminal, and a second conducting terminal; and
a resonator including the first and the second inductors connected electrically to a first and a second physical capacitors to form a differential inductor-capacitor (LC) tank, the resonator having a first and a second differential terminals and a third terminal, wherein
the third terminal of the resonator is connected to an alternative-current (AC) ground;

the first terminal of the resonator is connected to the first conducting terminal of the first three-terminal device and to the control terminal of the second three-terminal device;

the second terminal of the resonator is connected to the first conducting terminal of the second three-terminal device and to the control terminal of the first three terminal device;

the first conducting terminal of the third three-terminal device is connected to both the second conducting terminal of the first three-terminal device and the second conducting terminal of the second three-terminal device;

the first conducting terminal of the DC current source is connected to both the second conducting terminal of the first three-terminal device and the second conducting terminal of the second three-terminal device;

the DC current source and the third three-terminal device are connected in series between a voltage supply (VDD) and a ground (GND) through the second conducting terminal of the third three-terminal and the second conducting terminal of the DC current source;

the input terminal is connected to the control terminal of the third three-terminal device; and the first and the second differential terminals of the resonator are utilized as the first and the second differential output terminals.

24. An injection-locked frequency divider with enhancement of the injection ratio and of the locking range, which comprises:

a first circuit for receiving an AC input signal having a first frequency and for generating an injection AC current component in response to the input signal;

a second circuit that self-oscillates at a second frequency without the injection AC current component but, in the presence of the input injection AC current component of the first frequency, would generate a frequency that is sub-harmonic of the first frequency; and a third circuit for increasing an injection ratio between the injection AC current component and a DC current component in order to enlarge the locking range by providing the oscillator with a bleed current component coupled with the injection AC current component and the DC current component.

25. The injection-locked frequency divider of claim 24, wherein the third circuit is a current source.

26. The injection-locked frequency divider of claim 24, wherein the second circuit includes a differential transistor pair having a first and a second transistors.

27. The injection-locked frequency divider of claim 26, wherein the third circuit is a current source connected between a voltage source and a common first terminal of the first transistor and the second transistor.

28. The injection-locked frequency divider of claim 24, further comprising a voltage-to-current converter for generating an additional injection AC current component from the input signal by reusing the bleed current component.

* * * * *